(12) United States Patent
Shakeri et al.

(10) Patent No.: US 11,544,208 B2
(45) Date of Patent: *Jan. 3, 2023

(54) WAVE PIPELINE INCLUDING SYNCHRONOUS STAGE

(71) Applicant: MICRON TECHNOLOGY, INC., Boise, ID (US)

(72) Inventors: Kaveh Shakeri, Saratoga, CA (US); Ali Feiz Zarrin Ghalam, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/324,172

(22) Filed: May 19, 2021

(65) Prior Publication Data

US 2021/0271618 A1 Sep. 2, 2021

Related U.S. Application Data

(63) Continuation of application No. 16/448,188, filed on Jun. 21, 2019, now Pat. No. 11,061,836.

(51) Int. Cl.
| | | |
|---|---|---|
| *G06F 1/08* | (2006.01) | |
| *G06F 13/16* | (2006.01) | |
| *G11C 16/08* | (2006.01) | |
| *G11C 16/32* | (2006.01) | |
| *G11C 16/04* | (2006.01) | |

(52) U.S. Cl.
CPC ...... *G06F 13/1689* (2013.01); *G11C 16/0483* (2013.01); *G11C 16/08* (2013.01); *G11C 16/32* (2013.01)

(58) Field of Classification Search
CPC .......................................................... G06F 1/08
USPC .......................................................... 713/501
See application file for complete search history.

(56) References Cited

U.S. PATENT DOCUMENTS

| | | | | |
|---|---|---|---|---|
| 6,005,412 A | * | 12/1999 | Ranjan | G06F 13/4077 326/38 |
| 6,154,417 A | * | 11/2000 | Kim | G11C 7/1051 365/233.17 |
| 6,469,652 B1 | * | 10/2002 | Aude | H03M 1/0663 341/172 |
| 6,891,772 B2 | * | 5/2005 | Demone | G11C 11/408 365/230.03 |
| 6,952,115 B1 | * | 10/2005 | Andrews | G11C 7/1078 326/46 |
| 7,301,831 B2 | * | 11/2007 | Ware | G11C 7/22 365/194 |

(Continued)

*Primary Examiner* — Titus Wong
(74) *Attorney, Agent, or Firm* — Dicke, Billig & Czaja, PLLC

(57) ABSTRACT

A wave pipeline includes a data path and a clock path. The data path includes a plurality of wave pipeline data stages and a synchronous data stage. The synchronous data stage includes a first data latch to latch the data from the synchronous data stage. The synchronous data stage is between a first wave pipeline data stage of the plurality of wave pipeline data stages and a second wave pipeline data stage of the plurality of wave pipeline data stages. The clock path corresponds to the plurality of wave pipeline data stages. The first data latch latches the data from the synchronous data stage in response to a clock signal on the clock path.

18 Claims, 8 Drawing Sheets

(56) References Cited

U.S. PATENT DOCUMENTS

| | | | | |
|---|---|---|---|---|
| 7,464,282 | B1* | 12/2008 | Abdollahi-Alibeik | ............... H03L 7/0814 713/400 |
| 7,543,172 | B2* | 6/2009 | Kizer | ............... G11C 7/222 713/400 |
| 8,121,237 | B2* | 2/2012 | Stott | ............... H04L 7/0008 375/355 |
| 8,527,802 | B1* | 9/2013 | Tran | ............... G11C 7/1006 713/400 |
| 8,595,459 | B2* | 11/2013 | Ware | ............... G06F 3/0673 711/167 |
| 8,988,125 | B1* | 3/2015 | Ganusov | ............... H03K 5/14 327/261 |
| 9,460,803 | B1* | 10/2016 | Tang | ............... G11C 16/26 |
| 2002/0159303 | A1* | 10/2002 | Ware | ............... G11C 29/02 365/194 |
| 2003/0065900 | A1* | 4/2003 | Mes | ............... G11C 7/1039 711/169 |
| 2005/0251699 | A1* | 11/2005 | Jacobson | ............... G06F 1/10 713/400 |
| 2007/0043921 | A1* | 2/2007 | Kim | ............... G11C 7/1039 711/167 |
| 2009/0044038 | A1* | 2/2009 | Lee | ............... G06F 1/3203 713/501 |
| 2011/0239036 | A1* | 9/2011 | Jacobson | ............... G06F 9/3869 713/600 |
| 2015/0348605 | A1* | 12/2015 | Jang | ............... G11C 29/022 365/230.02 |

\* cited by examiner

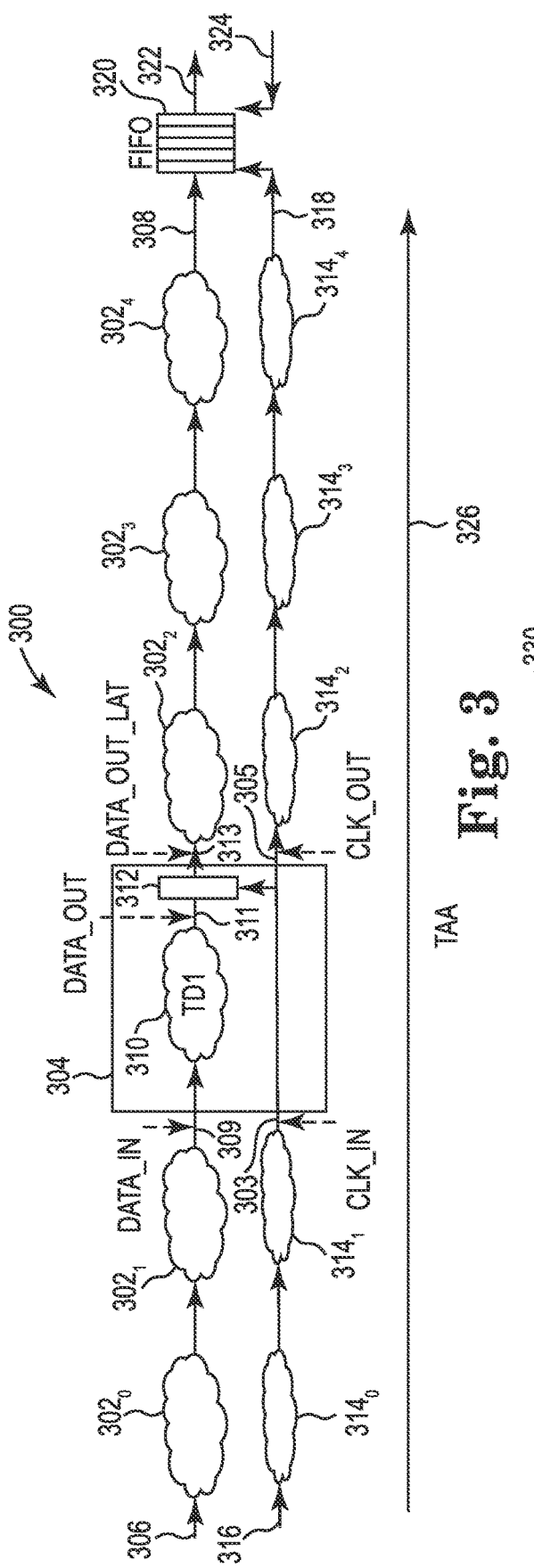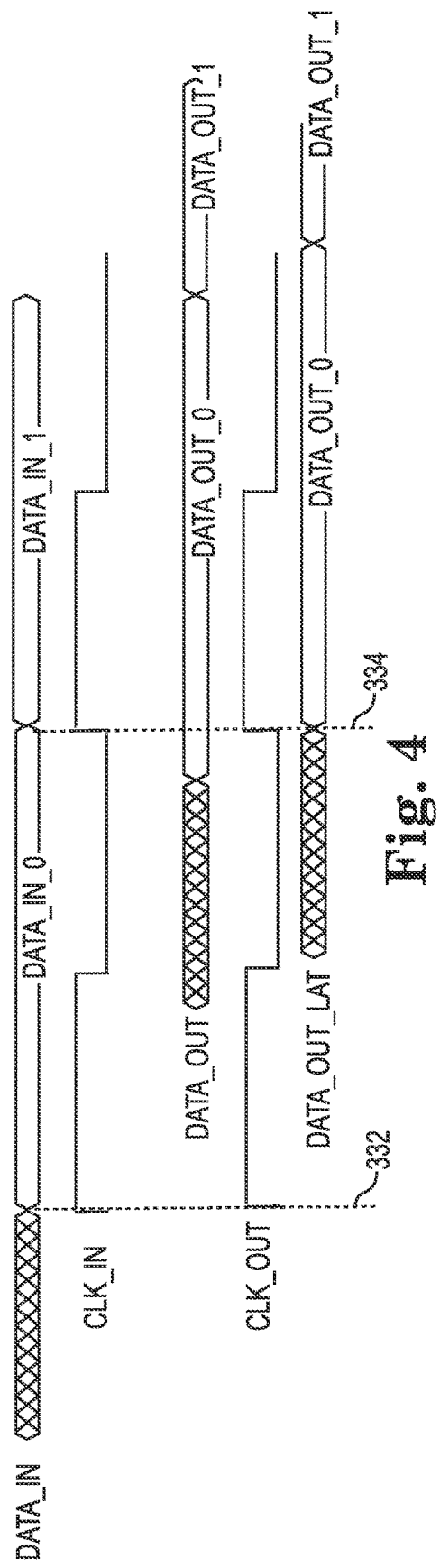

WAVE PIPELINE INCLUDING SYNCHRONOUS STAGE

RELATED APPLICATION

This Application is a Continuation of U.S. application Ser. No. 16/448,188, titled "WAVE PIPELINE INCLUDING SYNCHRONOUS STAGE," filed Jun. 21, 2019, issued as U.S. Pat. No. 11,061,836 on Jul. 13, 2021; which is commonly assigned and incorporated herein by reference.

TECHNICAL FIELD

The present disclosure relates generally to signal timing in integrated circuit devices. In particular, in one or more embodiments, the present disclosure relates to a wave pipeline including wave pipeline and synchronous stages in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

A wave pipeline may be used in a data path to send or receive data between different parts of an integrated circuit, such as a memory device. In a wave pipeline, the data signal and the clock signal move together (e.g., are aligned). In each stage of the wave pipeline, the data signal and the clock signal are delayed by the same amount. The time it takes for the data signal and the clock signal to reach the output of the wave pipeline determines the number of latch (e.g., FIFO) stages needed to latch the data at the output.

For the reasons stated above, and for other reasons stated below which will become apparent to those skilled in the art upon reading and understanding the present specification, there is a need in the art for alternative methods for sending or receiving data in a wave pipeline, and system and apparatus to perform such methods.

BRIEF DESCRIPTION OF THE DRAWINGS

FIG. 3 is a schematic diagram illustrating one example of a wave pipeline.

FIG. 4 is a timing diagram illustrating one example of the timing of signals of the synchronous data stage of the wave pipeline of FIG. 3.

DETAILED DESCRIPTION

Figure 1:
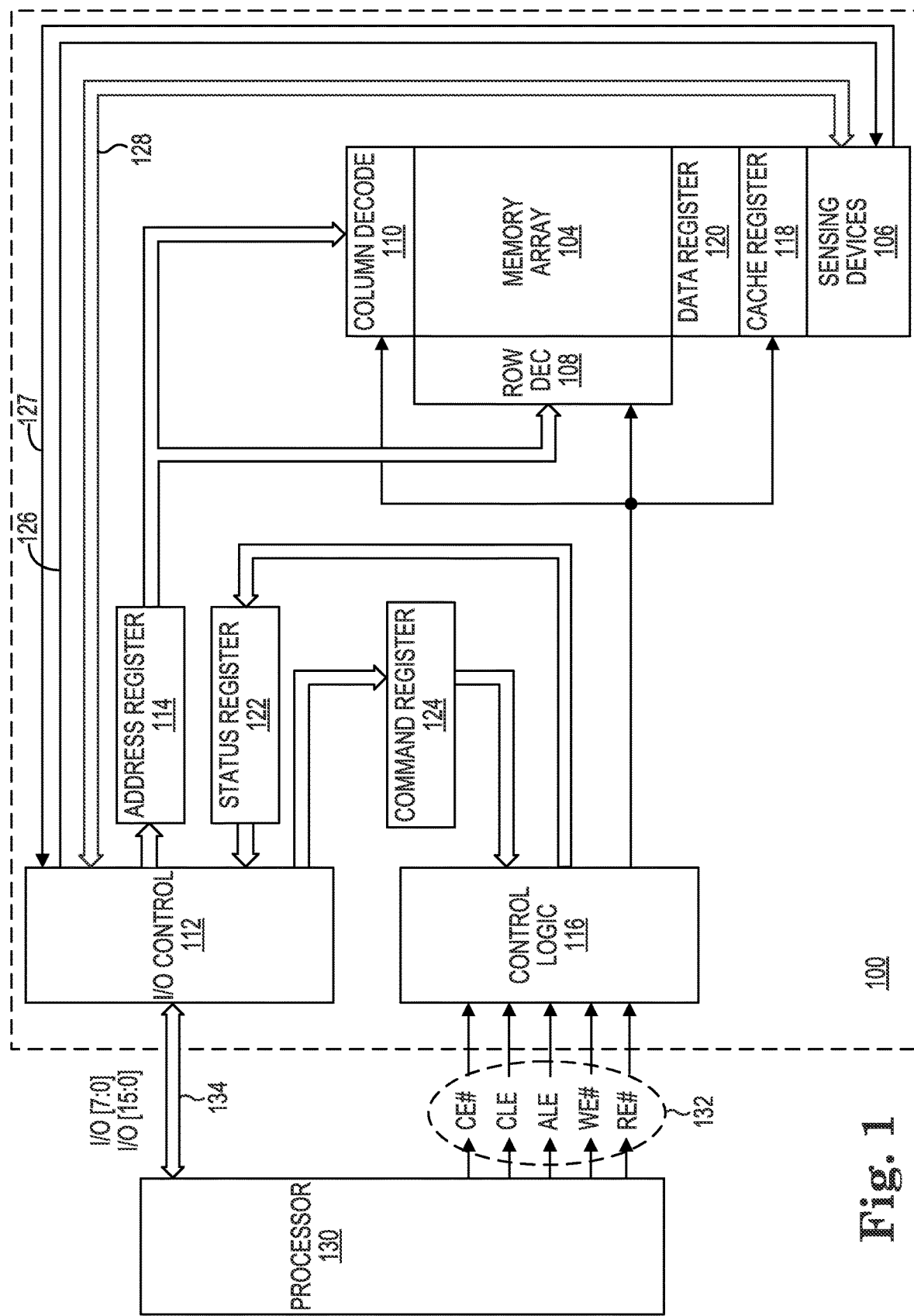
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are apparatus and methods for sending or receiving data between different parts of an integrated circuit, such as a memory device, using a wave pipeline including at least one synchronous stage. By using a synchronous stage or multiple synchronous stages in the wave pipeline, the time it takes for the data signal and the clock signal to reach the output of the wave pipeline may be less than if no synchronous stages are used. By reducing the time it takes for the data signal and the clock signal to reach the output of the wave pipeline, the number of latch (e.g., FIFO) stages needed to latch the data at the output may be reduced. In addition, a delay circuit to match the delay of each synchronous stage is not needed, thereby reducing power use.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes a wave pipeline including a synchronous stage or multiple synchronous stages for reading data out of memory device 100. A clock signal path 126 may be routed along with a data bus 128. A return clock signal path 127 also may be routed along with the data bus 128. A clock signal on the clock signal path 126 may be used to trigger data out of the sensing devices 106 (e.g., sense amplifiers). A return clock signal on the return clock signal path 127 may be used to latch the data from the sensing devices 106 into a data latch (e.g., FIFO) of input/output (I/O) control circuitry 112 just prior to outputting the data to processor 130. By routing the clock signal and the return clock signal along with the data, they may be subjected to the same logic circuitry and process, voltage, and temperature (PVT) variations as the data, and the setup and hold time margin at the data latch may be improved. It will be recognized that process variations typically experienced in fabrication will generally lead to variations in performance of circuits, even where those circuits are intended to be of the same design or otherwise provide the same functionality. Similarly, even small separations of circuits may expose those circuits to differing voltage and temperature values if measured to sufficient precision. Thus, while this disclosure seeks to mitigate the effects of such variations between clock signal paths and data paths, there is no expectation that such variations are necessarily eliminated.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, a write enable WE#, and a read enable RE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
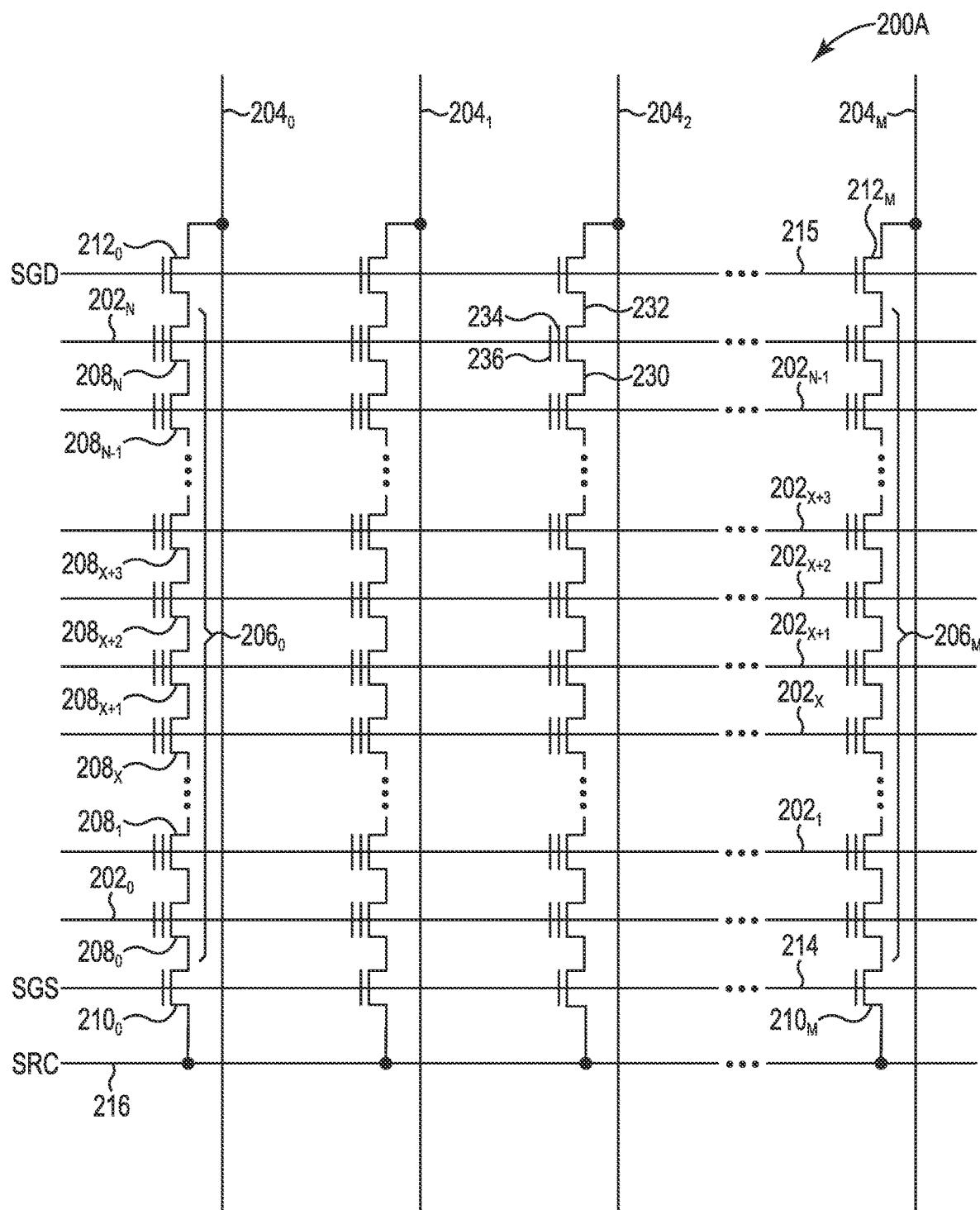
FIGS. 2A-2B are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212

(e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$, $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
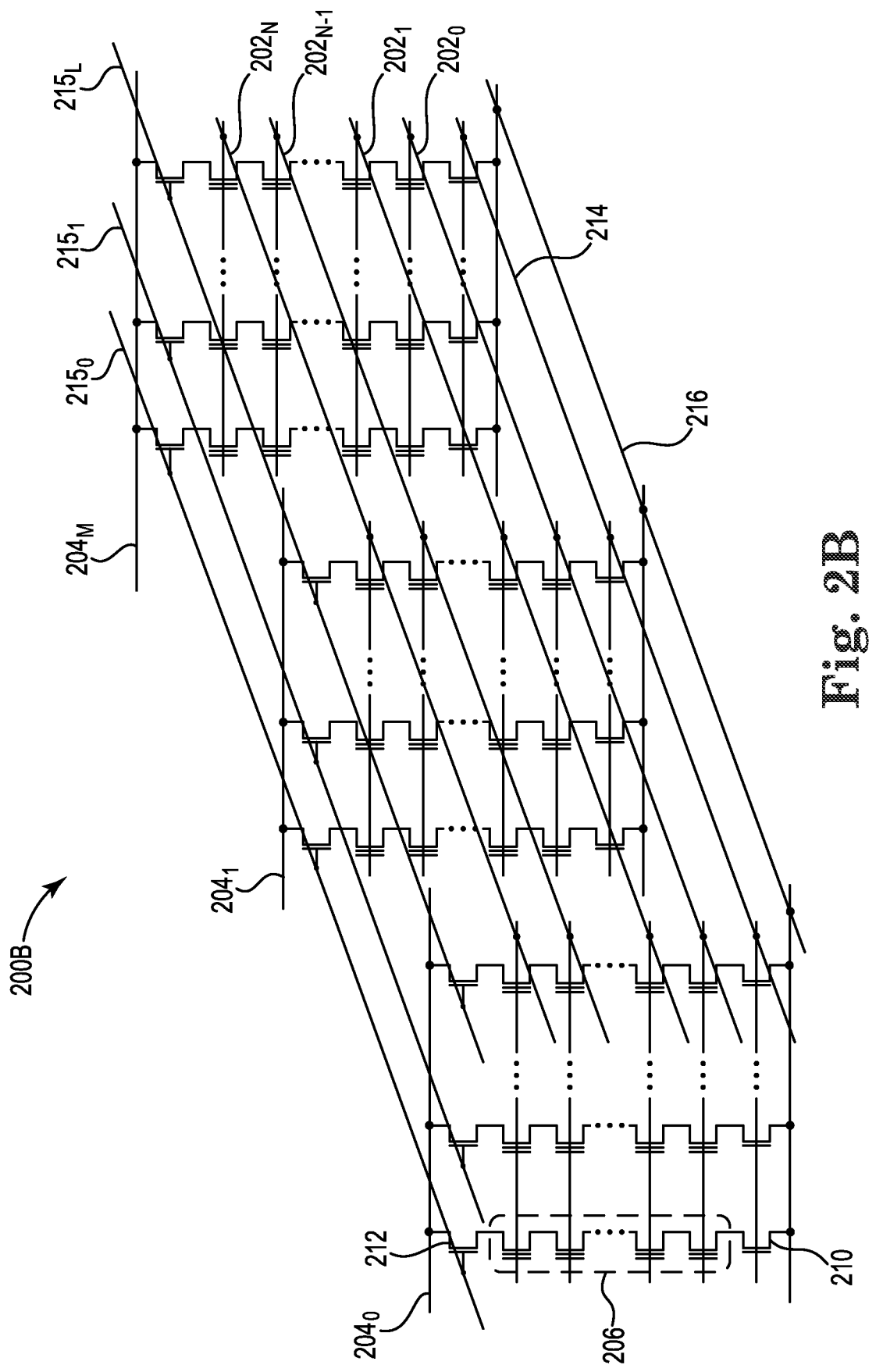

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 2A and 2B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

FIG. 3 is a schematic diagram illustrating one example of a wave pipeline 300. In one example, wave pipeline 300 may be part of memory device 100 of FIG. 1. Wave pipeline 300 includes a data path including a plurality of wave pipeline (e.g., asynchronous) data stages $302_0$ to $302_4$ and a synchronous data stage 304 between a data input node 306 and a data output node 308. In this example, the input of wave pipeline data stage $302_0$ is coupled to the data input node 306. The output of wave pipeline data stage $302_0$ is coupled to the input of wave pipeline data stage $302_1$, and the output of wave pipeline data stage $302_1$ is coupled to the data input of synchronous data stage 304 through a data input (DATA_IN) node 309. The data output of synchronous data stage 304 is coupled to the input of wave pipeline data stage $302_2$ through a latched data output (DATA_OUT_LAT) node 313. The output of wave pipeline data stage $302_2$ is coupled to the input of wave pipeline data stage $302_3$. The output of wave pipeline data stage $302_3$ is coupled to the input of wave pipeline data stage $302_4$, and the output of wave pipeline data stage $302_4$ is coupled to the data output node 308. Each wave pipeline data stage $302_0$ to $302_4$ processes received input data to provide processed output data. The time to process the data within each wave pipeline data stage $302_0$ to $302_4$ provides a delay of each wave pipeline data stage $302_0$ to $302_4$, respectively.

Wave pipeline 300 also includes a clock path including a plurality of clock stages $314_0$ to $314_4$ corresponding to the plurality of wave pipeline data stages $302_0$ to $302_4$ between an input clock node 316 and a return clock node 318. In this example, the input of clock stage $314_0$ is coupled to the clock input node 316. The output of clock stage $314_0$ is coupled to the input of clock stage $314_1$, and the output of clock stage $314_1$ is coupled to the clock input of synchronous data stage 304 through a clock input (CLK_IN) node 303. The clock output of synchronous data stage 304 is coupled to the input of clock stage $314_2$ through a clock output (CLK_OUT) node 305. The output of clock stage $314_2$ is coupled to the input of clock stage $314_3$. The output of clock stage $314_3$ is coupled to the input of clock stage $314_4$, and the output of clock stage $314_4$ is coupled to the return clock node 318. Each clock stage $314_0$ to $314_4$ has a delay configured to be equal to a delay of the corresponding wave pipeline data stage $302_0$ to $302_4$, respectively, such that the clock signal and the data move together (e.g., are aligned). In one example, a delay of each wave pipeline data stage $302_0$ to $302_4$ is less than one cycle of the clock signal.

While wave pipeline 300 includes five wave pipeline data stages and a corresponding five clock stages, in other embodiments wave pipeline 300 may include less than five wave pipeline data stages and corresponding clock stages or more than five wave pipeline data stages and corresponding clock stages.

The synchronous data stage 304 includes a data processing portion 310 and a first data latch 312 to latch the data from the synchronous data stage 304 (e.g., from data processing portion 310). Data is input to synchronous data stage 304 (e.g., to data processing portion 310) through the data input node 309. Data is output from the data processing portion 310 and input to the first data latch 312 through a data output (DATA_OUT) node 311. A clock signal is input to synchronous data stage 304 (e.g., to first data latch 312) through the clock input node 303. The first data latch 312 latches the data on the data output node 311 in response to the clock signal. First data latch 312 outputs the latched data to latched data output node 313. The clock signal on the clock input node 303 becomes the clock signal on the clock output node 305 without a delay. The time to process the data through data processing portion 310 between data input node 309 and data output node 311 is indicated by a delay TD1. In this example, TD1 is less than one cycle of the clock signal.

The synchronous data stage 304 is between a first wave pipeline data stage (e.g., wave pipeline data stage $302_1$ in this example) and a second wave pipeline data stage (e.g., wave pipeline data stage $302_2$ in this example) of the plurality of wave pipeline data stages $302_0$ to $302_4$. While synchronous data stage 304 is illustrated as being arranged between wave pipeline data stage $302_1$ and wave pipeline data stage $302_2$, in other embodiments synchronous data stage 304 may be arranged between other wave pipeline data stages of the plurality of wave pipeline data stages $302_0$ to $302_4$ of wave pipeline 300.

Wave pipeline 300 also includes a second data latch (e.g., FIFO) 320 to latch the data on the data output node 308 in response to a return clock signal on the return clock node 318. The data stored in FIFO 320 is output to an output data node 322 in response to an output clock signal on an output clock signal node 324. In one example, FIFO 320 includes a plurality of stages equal to the number of clock stages $314_0$ to $314_4$ (e.g., five in this example). It is noted that FIFO 320 does not include a stage for synchronous data stage 304 since the clock signal is not delayed by synchronous data stage 304. Therefore, by using synchronous data stage 304 in wave pipeline 300 in place of another wave pipeline data stage, FIFO 320 may be smaller compared to a FIFO in a wave pipeline that does not include synchronous data stage 304. In one example, FIFO 320 may be part of I/O control circuitry 112 of FIG. 1.

The time for the data on the data input node 306 to be processed through wave pipeline data stages $302_0$ to $302_4$ and synchronous data stage 304 and reach the data output node 308 (and for the clock signal on the input clock node 316 to be delayed through clock stages $314_0$ to $314_4$ and reach the return clock node 318) is indicated by a latency (e.g., address access time (TAA)) 326. By using synchronous data stage 304 in wave pipeline 300 in place of another wave pipeline data stage, the latency 326 may be reduced compared to a wave pipeline not including synchronous data stage 304. In addition, since synchronous data stage 304 does not include a clock stage to delay the clock signal, wave pipeline 300 may use less power than a wave pipeline not including synchronous data stage 304.

FIG. 4 is a timing diagram 330 illustrating one example of the timing of signals of the synchronous data stage 304 of the wave pipeline 300 of FIG. 3. Timing diagram 330 includes a DATA_IN signal representing data on data input node 309, a CLK_IN signal on clock input node 303, a DATA_OUT signal representing data on data output node 311, a CLK_OUT signal on clock output node 305, and a DATA_OUT_LAT signal representing data on latched data output node 313. In this example, processing portion 310 of synchronous data stage 304 begins processing first data (DATA_IN_0) at 332 as represented by the DATA_IN signal. After processing the first data, processing portion 310 outputs the first processed data (DATA_OUT_0) as represented by the DATA_OUT signal. The CLK_IN signal provides the CLK_OUT signal without a delay. At 334, in response to the CLK_IN signal (e.g., a rising edge of the CLK_IN signal), the data represented by the DATA_OUT signal is latched by first data latch 312, and first data latch 312 outputs the processed first data (DATA_OUT_0) as represented by the DATA_OUT_LAT signal. Also at 334, processing portion 310 of synchronous data stage 304 begins processing second data (DATA_IN_1) as represented by the DATA_IN signal and the process repeats. As shown in timing diagram 330, by including synchronous data stage 304 in wave pipeline 300, an additional clock cycle is used to latch the data in first data latch 312 such that two clock cycles are used to process the data through wave pipeline 300.

Figure 5:
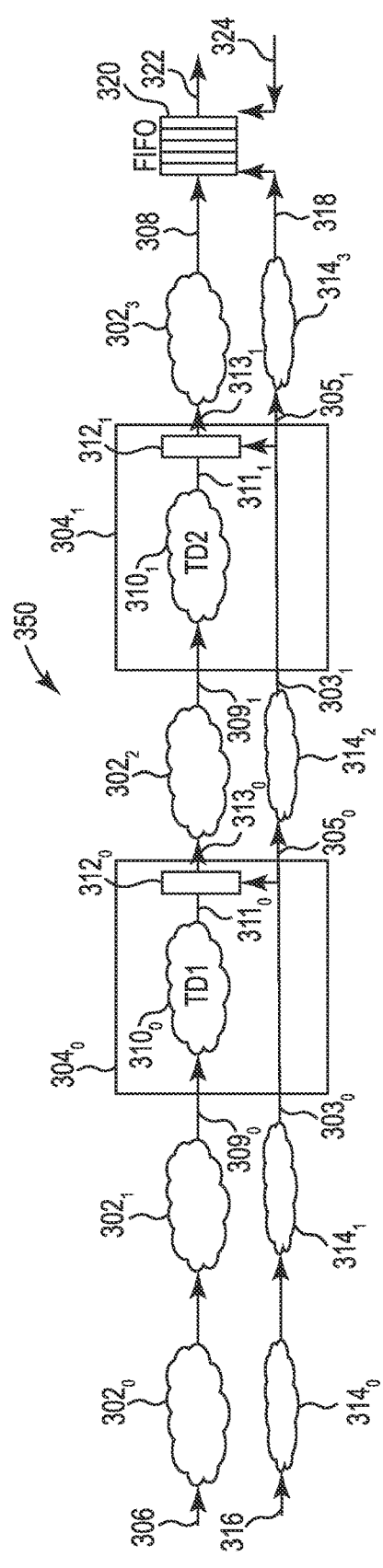
FIG. 5 is a schematic diagram illustrating one example of a wave pipeline including a plurality of synchronous data stages.

FIG. 5 is a schematic diagram illustrating one example of a wave pipeline 350 including a plurality of synchronous data stages $304_0$ to $304_1$. Wave pipeline 350 includes a data path including a plurality of wave pipeline data stages $302_0$ to $302_3$ and a plurality of synchronous data stages $304_0$ to $304_1$ between a data input node 306 and a data output node 308. In this example, the input of wave pipeline data stage $302_0$ is coupled to the data input node 306. The output of wave pipeline data stage $302_0$ is coupled to the input of wave pipeline data stage $302_1$, and the output of wave pipeline data stage $302_1$ is coupled to the data input of synchronous data stage $304_0$ through a data input node $309_0$. The data output of synchronous data stage $304_0$ is coupled to the input of wave pipeline data stage $302_2$ through a latched data output node $313_0$. The output of wave pipeline data stage $302_2$ is coupled to the data input of synchronous data stage $304_1$ through a data input node $309_1$. The data output of synchronous data stage $304_1$ is coupled to the input of wave pipeline data stage $302_3$ through a latched data output node $313_1$. The output of wave pipeline data stage $302_3$ is coupled to the data output node 308.

Wave pipeline 350 also includes a clock path including a plurality of clock stages $314_0$ to $314_3$ corresponding to the plurality of wave pipeline data stages $302_0$ to $302_3$ between an input clock node 316 and a return clock node 318. In this example, the input of clock stage $314_0$ is coupled to the clock input node 316. The output of clock stage $314_0$ is coupled to the input of clock stage $314_1$, and the output of clock stage $314_1$ is coupled to the clock input of synchronous data stage $304_0$ through a clock input node $303_0$. The clock output of synchronous data stage $304_0$ is coupled to the input of clock stage $314_2$ through a clock output node $305_0$. The output of clock stage $314_2$ is coupled to the clock input of synchronous data stage $304_1$ through a clock input node $303_1$. The clock output of synchronous data stage $304_1$ is coupled to the input of clock stage $314_3$ through a clock output node $305_1$. The output of clock stage $314_3$ is coupled to the return clock node 318.

Each synchronous data stage $304_0$ to $304_1$ includes a data processing portion $310_0$ to $310_1$ and a first data latch $312_0$ to $312_1$ to latch the data from the synchronous data stage $304_0$ to $304_1$ (e.g., from data processing portion $310_0$ to $310_1$), respectively. Data is input to each synchronous data stage $304_0$ to $304_1$ (e.g., to data processing portion $310_0$ to $310_1$) through the data input node $309_0$ to $309_1$, respectively. Data is output from each data processing portion $310_0$ to $310_1$ and input to the first data latch $312_0$ to $312_1$ through a data output node $311_0$ to $311_1$, respectively. A clock signal is input to each synchronous data stage $304_0$ to $304_1$ (e.g., to first data latch $312_0$ to $312_1$) through the clock input node $303_0$ to $303_1$, respectively. Each first data latch $312_0$ to $312_1$ latches the data on the data output node $311_0$ to $311_1$, respectively, in response to the clock signal. Each first data latch $312_0$ to $312_1$ outputs the latched data to latched data output node $313_0$ to $313_1$, respectively. The clock signal on each clock input node $303_0$ to $303_1$ becomes the clock signal on the clock output node $305_0$ to $305_1$, respectively, without a delay. The time to process the data through each data processing portion $310_0$ to $310_1$ between data input node $309_0$ to $309_1$ and data output node $311_0$ to $311_1$ is indicated by delays TD1 and TD2, respectively. In this example, TD1 and TD2 are each less than one cycle of the clock signal.

Wave pipeline 350 also includes a second data latch (e.g., FIFO) 320 to latch the data on the data output node 308 in response to a return clock signal on the return clock node 318. The data stored in FIFO 320 is output to an output data node 322 in response to an output clock signal on an output clock signal node 324. In one example, FIFO 320 includes a plurality of stages equal to the number of clock stages $314_0$ to $314_3$ (e.g., four in this example). It is noted that FIFO 320 does not include a stage for each synchronous data stage $304_0$ to $304_1$ since the clock signal is not delayed by synchronous data stages $304_0$ to $304_1$. Therefore, by using synchronous data stages $304_0$ to $304_1$ in wave pipeline 350, FIFO 320 may be smaller compared to a FIFO in a wave pipeline that does not include synchronous data stages $304_0$ to $304_1$ and compared to a wave pipeline including fewer synchronous data stages, such as wave pipeline 300 of FIG. 3.

The time for the data on the data input node 306 to be processed through wave pipeline data stages $302_0$ to $302_3$ and synchronous data stages $304_0$ to $304_1$ and reach the data output node 308 (and for the clock signal on the input clock node 316 to be delayed through clock stages $314_0$ to $314_3$ and reach the return clock node 318) is indicated by a latency (e.g., address access time (TAA)) 326. By using multiple synchronous data stages $304_0$ to $304_1$ in wave pipeline 350, the latency 326 may be reduced compared to a wave pipeline not including synchronous data stages $304_0$ to $304_1$ and compared to a wave pipeline including fewer synchronous data stages, such as wave pipeline 300 of FIG. 3. In addition, since synchronous data stages $304_0$ to $304_1$ do not include a clock stage to delay the clock signal, wave pipeline 350 may use less power than a wave pipeline not including synchronous data stages $304_0$ to $304_1$ and compared to a wave pipeline including fewer synchronous data stages, such as wave pipeline 300 of FIG. 3.

In this example, by including multiple synchronous data stages $304_0$ to $304_1$ in wave pipeline 350, an additional clock cycle is used to latch the data in each first data latch $312_0$ to $312_1$ such that three clock cycles are used to process the data through wave pipeline 350. While wave pipeline 350 includes two synchronous data stages $304_0$ to $304_1$, in other embodiments wave pipeline 350 may include more than two synchronous data stages. In this case, the number of clock cycles used to process the data through the wave pipeline would be equal to the number of synchronous data stages plus one.

Figure 6:
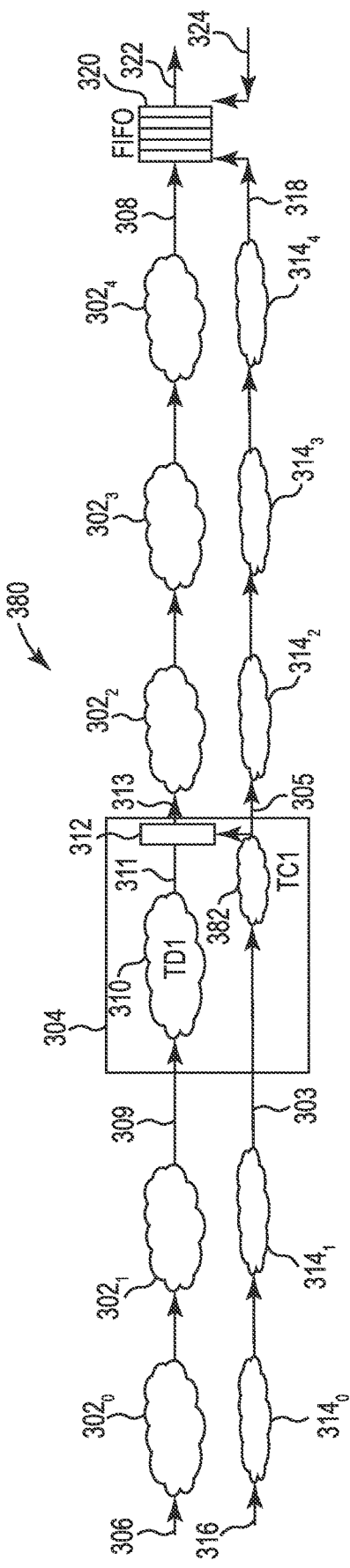
FIG. 6 is a schematic diagram illustrating another example of a wave pipeline.

FIG. 6 is a schematic diagram illustrating another example of a wave pipeline 380. Wave pipeline 380 is similar to wave pipeline 300 previously described and illustrated with reference to FIG. 3, except that synchronous data stage 304 of wave pipeline 380 includes a delay stage 382 in the clock path. Delay stage 382 delays the clock signal on the clock input node 303 by a delay TCI to provide the clock signal on the clock output node 305. In this example, the delay TD1 of processing portion 310 of synchronous data stage 304 may be greater than one cycle of the clock signal. The delay TCI of the delay stage 382 may be less than the delay TD1. In one example, the delay TD1 is less than the delay TCI plus one cycle of the clock signal. The delay TCI in the clock path provides additional setup time for processing portion 310 of synchronous data stage 304.

Figure 7:
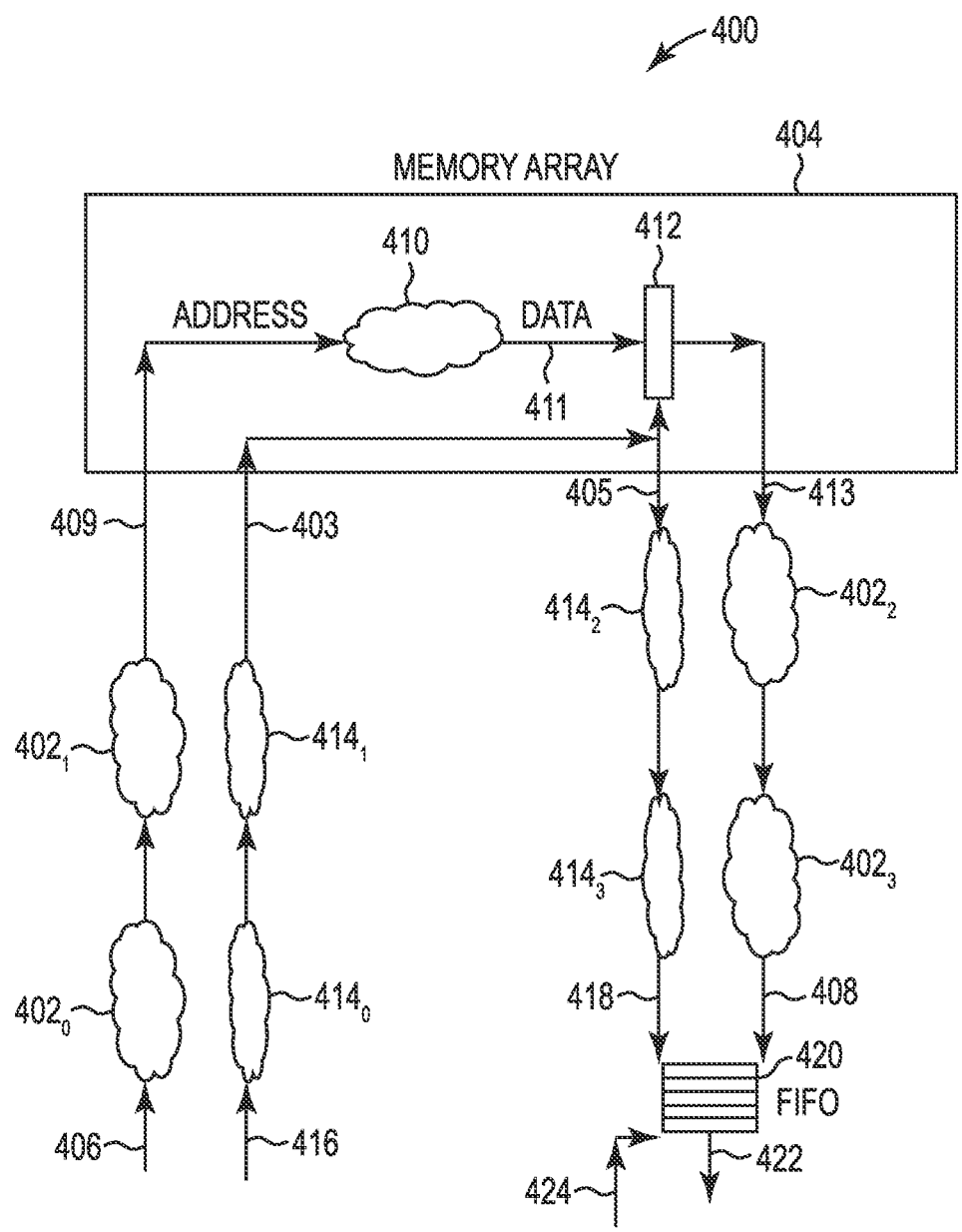
FIG. 7 is a schematic diagram illustrating one example of a wave pipeline of a memory.

FIG. 7 is a schematic diagram illustrating one example of a wave pipeline 400 of a memory. Wave pipeline 400 may be used to output data from a memory array, such as memory array 104 of memory device 100 of FIG. 1. Wave pipeline 400 includes a synchronous data stage 404 to output data from the memory array in response to an address signal. Synchronous data stage 404 includes a first data latch 412 to latch the output data. Wave pipeline 400 includes a plurality of wave pipeline stages $402_0$ to $402_3$, where wave pipeline stages $402_0$ to $402_1$ may be wave pipeline address stages and wave pipeline stages $402_2$ to $402_3$ may be wave pipeline data stages. Wave pipeline 400 includes an address path coupled to an input of the synchronous data stage 404. The address path includes the plurality of wave pipeline address stages $402_0$ to $402_1$ between an address input node 406 and an input node 409 of the synchronous data stage 404. Wave pipeline 400 also includes a data path coupled to an output of the synchronous data stage 404. The data path includes the plurality of wave pipeline data stages $402_2$ to $402_3$ between an output node 413 of the synchronous data stage 404 and a data output node 408.

Wave pipeline 400 also includes an input clock path including a plurality of input clock stages $414_0$ to $414_1$ between a clock input node 416 and an input node 403 of synchronous data stage 404. Each clock stage $414_0$ to $414_1$ corresponds to the wave pipeline address stages $402_0$ to $402_1$ and includes a delay configured to be equal to a delay of the corresponding wave pipeline address stage $402_0$ to $402_1$, respectively, such that the clock signal and the address move together (e.g., are aligned). In one example, a delay of each wave pipeline address stage $402_0$ to $402_1$ is less than one cycle of the clock signal. Wave pipeline 400 also includes a return clock path coupled to the input clock path at the first data latch 412. The return clock path includes a plurality of return clock stages $414_2$ to $414_3$ between an output node 405 of the synchronous data stage 404 and a return clock node 418. Each return clock stage $414_2$ to $414_3$ corresponds to the plurality of wave pipeline data stages $402_2$ to $402_3$ and includes a delay configured to be equal to a delay of the corresponding wave pipeline data stage $402_2$ to $402_3$, respectively, such that the clock signal and the data move together (e.g., are aligned). In one example, a delay of each wave pipeline data stage $402_2$ to $402_3$ is less than one cycle of the clock signal.

In this example, the input of wave pipeline address stage $402_0$ is coupled to the address input node 406. The output of wave pipeline address stage $402_0$ is coupled to the input of wave pipeline address stage $402_1$, and the output of wave pipeline address stage $402_1$ is coupled to the address input of synchronous data stage 404 through the input node 409. The data output of synchronous data stage 404 is coupled to the input of wave pipeline data stage $402_2$ through the output node 413. The output of wave pipeline data stage $402_2$ is coupled to the input of wave pipeline data stage $402_3$. The output of wave pipeline data stage $402_3$ is coupled to the data output node 408.

The input of input clock stage $414_0$ is coupled to the clock input node 416. The output of input clock stage $414_0$ is coupled to the input of input clock stage $414_1$, and the output of input clock stage $414_1$ is coupled to the clock input of synchronous data stage 404 through input node 403. The clock output of synchronous data stage 404 is coupled to the input of return clock stage $414_2$ through output node 405. The output of return clock stage $414_2$ is coupled to the input of return clock stage $414_3$. The output of return clock stage $414_3$ is coupled to the return clock node 418.

The synchronous stage 404 includes a data processing portion 410 and the first data latch 412 to latch the data from the synchronous data stage 404 (e.g., from data processing portion 410). An address is input to synchronous data stage 404 (e.g., to data processing portion 410) through the input node 409. The data within the memory array corresponding to the address is retrieved from the memory array. The retrieved data is output from the data processing portion 410 and input to the first data latch 412 through a data output node 411. A clock signal is input to synchronous data stage 404 (e.g., to first data latch 412) through the input node 403. The first data latch 412 latches the data on the data output node 411 in response to the clock signal. First data latch 412 outputs the latched data to output node 413. The clock signal on the input node 403 becomes the clock signal on the output node 405 without a delay. In one example, the time to process the data through data processing portion 410 between input node 409 and data output node 411 (e.g., a delay of synchronous data stage 404) is less than one cycle of the clock signal.

Wave pipeline 400 also includes a second data latch (e.g., FIFO) 420 to latch the data on the data output node 408 in response to a return clock signal on the return clock node 418. The data stored in FIFO 420 is output to an output node 422 in response to an output clock signal on an output clock signal node 424. In one example, FIFO 420 includes a plurality of stages equal to the number of clock stages $414_0$ to $414_3$ (e.g., four in this example). It is noted that FIFO 420 does not include a stage for synchronous data stage 404 since the clock signal is not delayed by synchronous data stage 404. Therefore, by using synchronous data stage 404 in wave pipeline 400 in place of another wave pipeline data stage, FIFO 420 may be smaller compared to a FIFO in a wave pipeline that does not include synchronous data stage 404. In one example, FIFO 420 may be part of I/O control circuitry 112 of FIG. 1.

Figure 8A:
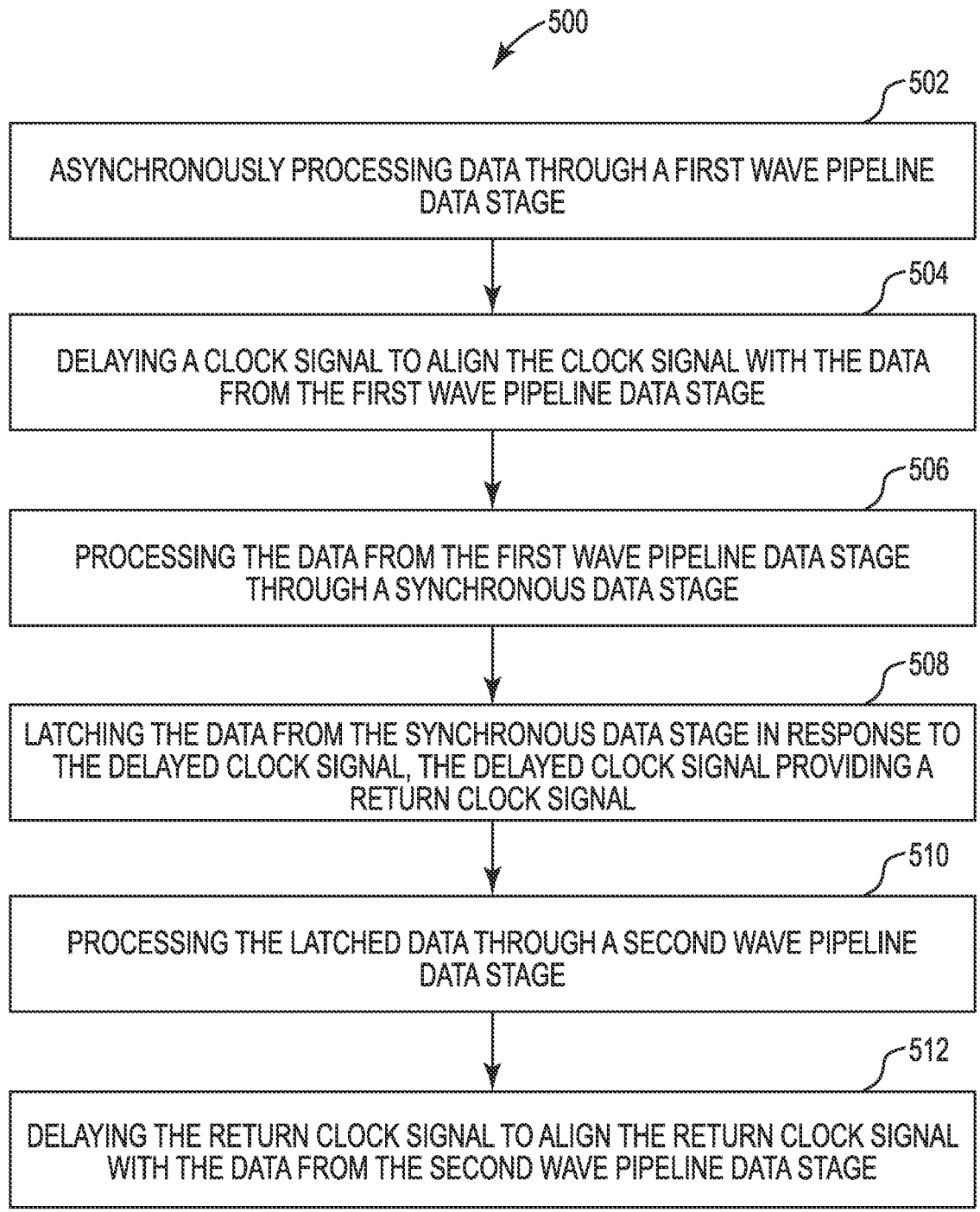
FIGS. 8A-8C are flow diagrams illustrating one example of a method for processing data through a wave pipeline.
Figure 8B:
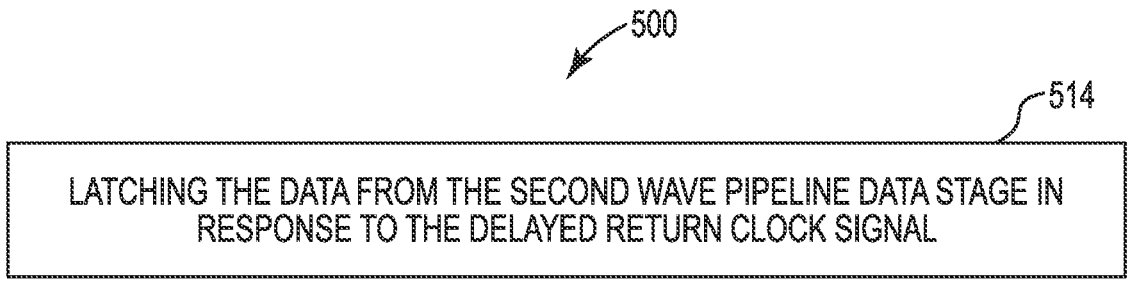
Figure 8C:
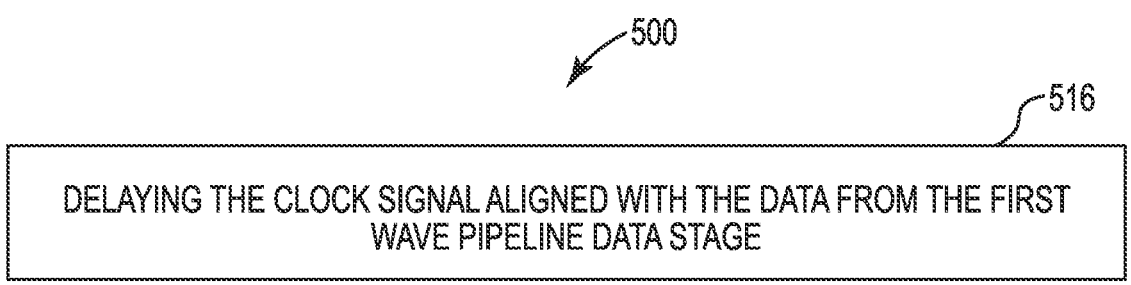

FIGS. 8A-8C are flow diagrams illustrating one example of a method 500 for processing data through a wave pipeline. In one example, method 500 may be implemented by wave pipeline 300 of FIG. 3, wave pipeline 350 of FIG. 5, wave pipeline 380 of FIG. 6, or wave pipeline 400 of FIG. 7. As illustrated in FIG. 8A, at 502 method 500 includes asynchronously processing data through a first wave pipeline data stage. At 504, method 500 includes delaying a clock signal to align the clock signal with the data from the first wave pipeline data stage. At 506, method 500 includes processing the data from the first wave pipeline data stage through a synchronous data stage. In one example, processing the data from the first wave pipeline data stage through the synchronous data stage includes processing the data from the first wave pipeline data stage through the synchronous data stage in less than one cycle of the clock signal. At 508, method 500 includes latching the data from the synchronous data stage in response to the delayed clock signal, the delayed clock signal providing a return clock signal. At 510, method 500 includes processing the latched data through a second wave pipeline data stage. At 512, method 500 includes delaying the return clock signal to align the return clock signal with the data from the second wave pipeline data stage.

As illustrated in FIG. 8B, at 514 method 500 may further include latching the data from the second wave pipeline data stage in response to the delayed return clock signal. In one example, latching the data from the second wave pipeline data stage includes latching the data from the second wave pipeline data stage in a FIFO. As illustrated in FIG. 8C, at 516 method 500 may further include delaying the clock signal aligned with the data from the first wave pipeline data stage. In this case, processing the data from the first wave pipeline data stage through the synchronous data stage may include processing the data from the first wave pipeline data stage through the synchronous data stage in more than one cycle of the clock signal.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A wave pipeline comprising:
   a data path comprising a plurality of wave pipeline data stages and a synchronous data stage, the synchronous data stage comprising a first data latch to latch the data from the synchronous data stage, and the synchronous data stage between a first wave pipeline data stage of the plurality of wave pipeline data stages and a second wave pipeline data stage of the plurality of wave pipeline data stages; and a clock path corresponding to the plurality of wave pipeline data stages, wherein the first data latch latches the data from the synchronous data stage in response to a clock signal on the clock path.

2. The wave pipeline of claim 1, wherein the clock path comprises a plurality of clock stages corresponding to the plurality of wave pipeline data stages, each clock stage of the plurality of clock stages having a delay configured to be equal to a delay of the corresponding wave pipeline data stage of the plurality of wave pipeline data stages.

3. The wave pipeline of claim 2, further comprising:

a second data latch, wherein the data path comprises a data input node and a data output node, wherein the clock path comprises an input clock node and a return clock node, and wherein the second data latch is to latch the data on the data output node in response to a return clock signal on the return clock node.

4. The wave pipeline of claim 3, wherein the second data latch comprises a FIFO.

5. The wave pipeline of claim 1, wherein a delay of each wave pipeline data stage of the plurality of wave pipeline data stages is less than one cycle of the clock signal.

6. The wave pipeline of claim 1, wherein a delay of the synchronous data stage is less than one cycle of the clock signal.

7. The wave pipeline of claim 1, wherein a delay of the synchronous data stage is greater than one cycle of the clock signal, and wherein the clock path further comprises a delay stage such that the first data latch latches the data from the synchronous data stage in response to a delayed clock signal from the delay stage.

8. The wave pipeline of claim 7, wherein a delay of the delay stage is less than a delay of the synchronous data stage.

9. The wave pipeline of claim 1, wherein the data path comprises a plurality of synchronous data stages, each synchronous data stage of the plurality of synchronous data stages comprising a first data latch to latch the data from the corresponding synchronous data stage of the plurality of synchronous data stages, and wherein each first data latch of the plurality of synchronous data stages latches the data from the corresponding synchronous data stage in response to the clock signal on the clock path.

10. A memory comprising:

a memory array;

a synchronous data stage to output data from the memory array in response to an address signal, the synchronous data stage comprising a first data latch to latch the output data;

an address path coupled to an input of the synchronous data stage, the address path comprising a plurality of wave pipeline address stages;

a data path coupled to an output of the synchronous data stage, the data path comprising a plurality of wave pipeline data stages;

an input clock path corresponding to the plurality of wave pipeline address stages; and a return clock path coupled to the input clock path at the first data latch, the return clock path corresponding to the plurality of wave pipeline data stages, wherein the first data latch latches the output data in response to a clock signal on the input clock path.

11. The memory of claim 10, wherein the input clock path comprises a plurality of input clock stages corresponding to the plurality of wave pipeline address stages, each input clock stage of the plurality of input clock stages comprising a delay configured to be equal to a delay of the corresponding wave pipeline address stage of the plurality of wave pipeline address stages.

12. The memory of claim 10, wherein the return clock path comprises a plurality of return clock stages corresponding to the plurality of wave pipeline data stages, a delay of each return clock stage of the plurality of return clock stages equal to a delay of the corresponding wave pipeline data stage of the plurality of wave pipeline data stages.

13. The memory of claim 10, further comprising:

a latch to latch the data from the data path in response to a return clock signal from the return clock path.

14. The memory of claim 13, wherein the latch comprises a FIFO.

15. The memory of claim 10, wherein a delay of each wave pipeline address stage of the plurality of wave pipeline address stages is less than one cycle of the clock signal, and wherein a delay of each wave pipeline data stage of the plurality of wave pipeline data stages is less than one cycle of the clock signal.

16. The memory of claim 10, wherein a delay of the synchronous data stage is less than one cycle of the clock signal.

17. The memory of claim 10, wherein the memory array comprises a NAND memory array.

18. A method for processing data through a wave pipeline, the method comprising:

asynchronously processing data through a first wave pipeline data stage;

aligning a clock signal with the data from the first wave pipeline data stage;

processing the data from the first wave pipeline data stage through a synchronous data stage;

latching the data from the synchronous data stage in response to the clock signal;

processing the latched data through a second wave pipeline data stage;

aligning the clock signal with the data from the second wave pipeline data stage; and latching the data from the second wave pipeline data stage in response to the clock signal.

* * * * *